(12) United States Patent
Goeke

(10) Patent No.: US 9,274,145 B2
(45) Date of Patent: Mar. 1, 2016

(54) ACTIVE SHUNT AMMETER APPARATUS AND METHOD

(71) Applicant: Keithley Instruments, Inc., Cleveland, OH (US)

(72) Inventor: Wayne C. Goeke, Hudson, OH (US)

(73) Assignee: TEKTRONIX, INC., Beaverton, OR (US)

( * ) Notice: Subject to any disclaimer, the term of this patent is extended or adjusted under 35 U.S.C. 154(b) by 116 days.

(21) Appl. No.: 13/657,549

(22) Filed: Oct. 22, 2012

(65) Prior Publication Data

US 2014/0111188 A1    Apr. 24, 2014

(51) Int. Cl.
| | |
|---|---|
| *G01R 1/30* | (2006.01) |
| *G01R 1/20* | (2006.01) |
| *H03F 3/45* | (2006.01) |
| *G01R 19/00* | (2006.01) |
| *H03F 1/34* | (2006.01) |

(52) U.S. Cl.
CPC ............ *G01R 1/203* (2013.01); *H03F 3/45475* (2013.01); *G01R 19/0023* (2013.01); *G01R 19/0092* (2013.01); *H03F 1/34* (2013.01); *H03F 2200/261* (2013.01); *H03F 2203/45138* (2013.01)

(58) Field of Classification Search
CPC ..... G01R 15/185; G01R 15/205; G01R 19/20
USPC ................ 324/123 R, 123, 76, 117, 121, 122
See application file for complete search history.

(56) References Cited

U.S. PATENT DOCUMENTS

| | | | | |
|---|---|---|---|---|
| 3,787,776 A | * | 1/1974 | Cath .......................... | H03F 1/26 330/103 |
| 4,785,237 A | * | 11/1988 | Cox ...................... | G01R 19/155 324/123 R |
| 4,916,329 A | * | 4/1990 | Dang ........................ | G05F 1/24 307/66 |
| 4,998,026 A | * | 3/1991 | King .................... | H03K 17/667 324/523 |

(Continued)

OTHER PUBLICATIONS

Ferrari Giorgio et al, "Wide bandwidth transimpedance amplifier for extremely high sensitivity continuous measurements", Review of Scientific Instruments, AIP, Melville, NY, US, vol. 78, No. 9, Sep. 25, 2007, pp. 94703-94703, XP012104222.

(Continued)

*Primary Examiner* — Tung X Nguyen
*Assistant Examiner* — Dominic Hawkins
(74) *Attorney, Agent, or Firm* — Michael A. Nelson; Marger Johnson

(57) ABSTRACT

An active shunt ammeter for measuring current flowing through a device under test (DUT) and method are disclosed. The active shunt ammeter includes an input configured to receive an input signal having a frequency within a frequency band and representing the current flowing through the DUT. An output is configured to generate an output voltage representing the current flowing through the DUT. The active shunt ammeter also includes a gain circuit having an amplifier with a gain characteristic that varies respect to frequency within the frequency band and a feedback element having an impedance coupled from an output of the gain circuit to a negative input of the gain circuit, the feedback element impedance being configured to change with frequency to correlate with the amplifier gain characteristic such that the feedback element impedance divided by the amplifier gain over the frequency band has minimal frequency dependency.

16 Claims, 7 Drawing Sheets

(56) References Cited

U.S. PATENT DOCUMENTS

| | | | | |
|---|---|---|---|---|
| 5,039,934 A | * | 8/1991 | Banaska | G05F 1/573 323/268 |
| 5,144,154 A | | 9/1992 | Banaska | |
| 6,035,049 A | * | 3/2000 | Engh | H03F 3/005 330/109 |
| 6,600,371 B2 | * | 7/2003 | Cali | H03F 3/45089 330/149 |
| 7,023,271 B1 | | 4/2006 | Aram | |
| 2004/0070446 A1 | * | 4/2004 | Krupka | G01R 29/0871 330/69 |
| 2006/0209632 A1 | * | 9/2006 | Goodman | G01N 29/14 367/13 |
| 2008/0111560 A1 | | 5/2008 | Regier | |
| 2008/0258818 A1 | * | 10/2008 | Ngo | H03F 1/56 330/282 |
| 2009/0290728 A1 | * | 11/2009 | Berg | H03F 1/34 381/121 |
| 2011/0140945 A1 | * | 6/2011 | Sundblad | H03F 3/45475 341/155 |
| 2012/0249235 A1 | * | 10/2012 | Zare-Hoseini | H03G 1/0088 330/86 |

OTHER PUBLICATIONS

European Search Report for European Application No. 13189569.0, dated Aug. 11, 2015, 12 pages, Munich.

* cited by examiner

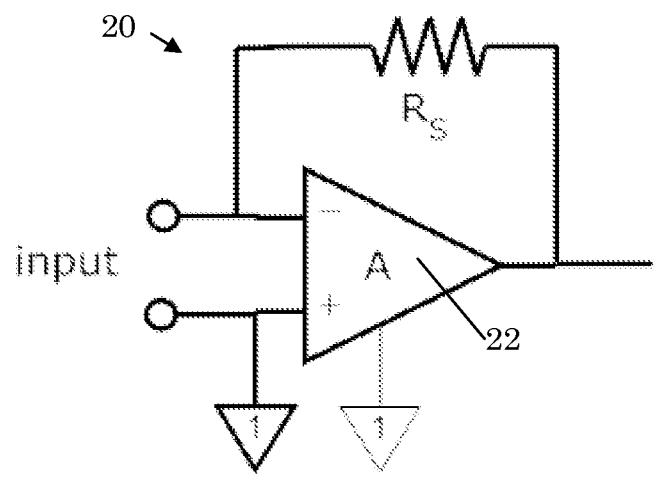
Figure 1B
(PriorArt)

ACTIVE SHUNT AMMETER APPARATUS AND METHOD

FIELD OF INVENTION

This invention relates generally to electrical measurement equipment and, in particular, to an active shunt ammeter for use in measuring electrical current.

BACKGROUND

Source measure units (SMU) are used to make precision measurements in many fields, including the testing of semiconductor products. For example, U.S. Pat. No. 5,039,934 describes one such device and range-changing in such a device is described in U.S. Pat. No. 5,144,154, both of which are incorporated herein by reference in their entireties. Typical SMU designs include a voltage or current source with integrated voltage and current measurement capabilities. A device under test (DUT) is coupled to the SMU and is then stimulated with either the voltage or current source.

There are several ways in which the current through a DUT may be measured. For example, a shunt ammeter, may be used to simply sense the voltage across a resistor $R_S$. $R_S$ must be kept small to not cause a large burden voltage to the input signal. A low noise gain stage is required to amplify the burden voltage so it can be measured.

A feedback ammeter uses a high gain op-amp to pull the input circuit through the resistor $R_S$. The op-amp keeps the burden voltage low because of its high dc gain (typically greater than 1 million). This allows $R_S$ to be larger allowing the output signal to be larger. However, the op-amps high gain begins to roll off at relatively low frequencies. This causes the burden voltage to increase at higher frequencies as well. If the input is capacitive, it can cause the feedback ammeter to ring or even oscillate. It would be desirable to provide improved ammeter configurations that address these problems.

SUMMARY OF THE INVENTION

An active shunt ammeter for measuring current flowing through a device under test (DUT) and method are disclosed. The active shunt ammeter includes an input configured to receive an input signal having a frequency within a frequency band and representing the current flowing through the DUT. An output is configured to generate an output voltage representing the current flowing through the DUT. The active shunt ammeter also includes a gain circuit having an amplifier with a gain characteristic that varies respect to frequency within the frequency band and a feedback element having an impedance coupled from an output of the gain circuit to a negative input of the gain circuit, the feedback element impedance being configured to change with frequency to correlate with the amplifier gain characteristic such that the feedback element impedance divided by the amplifier gain over the frequency band has minimal frequency dependency.

The amplifier may have a parallel RC feedback element. The amplifier may be a differential amplifier with a parallel RC feedback element coupled between a negative-input terminal and an output terminal. The gain circuit may have an input impedance that remains generally constant across the entire bandwidth of the amplifier based on the gain characteristic and the feedback element impedance. The amplifier may have a controlled negative gain across the feedback element. The amplifier may have an inverting stage having a gain set by a resistor ratio. The amplifier may have a gain that is split between two operational amplifiers (op-amps). A voltage across the feedback element may be buffered and attenuated by a resistor ratio. The amplifier may have an input op-amp with a gain placed in its feedback path.

A method of measuring current flowing through a device under test (DUT) is also disclosed, the method includes receiving an input signal having a frequency within a frequency band and representing the current flowing through the DUT. An output voltage is generated, the output voltage representing the current flowing through the DUT. A gain circuit is provided. The gain circuit has an amplifier with a gain characteristic that varies respect to frequency within the frequency band and a feedback element having an impedance coupled from an output of the gain circuit to a negative input of the gain circuit, the feedback element impedance being configured to change with frequency to correlate with the amplifier gain characteristic such that the feedback element impedance divided by the amplifier gain over the frequency band has minimal frequency dependency.

The amplifier may have a parallel RC feedback element. The amplifier may be a differential amplifier with a parallel RC feedback element coupled between a negative-input terminal and an output terminal. The gain circuit may have an input impedance that remains generally constant across the entire bandwidth of the amplifier based on the gain characteristic and the feedback element impedance. The amplifier may have a controlled negative gain across the feedback element. The amplifier may have an inverting stage having a gain set by a resistor ratio. The amplifier may have a gain that is split between two operational amplifiers (op-amps). A voltage across the feedback element may be buffered and attenuated by a resistor ratio. The amplifier may have an input op-amp with a gain placed in its feedback path.

BRIEF DESCRIPTION OF THE FIGURES

FIG. 1B is a basic diagram of a feedback ammeter configured with a high gain op-amp to pull the input circuit through a resistor $R_S$;

DETAILED DESCRIPTION OF THE INVENTION

Figure 1A:
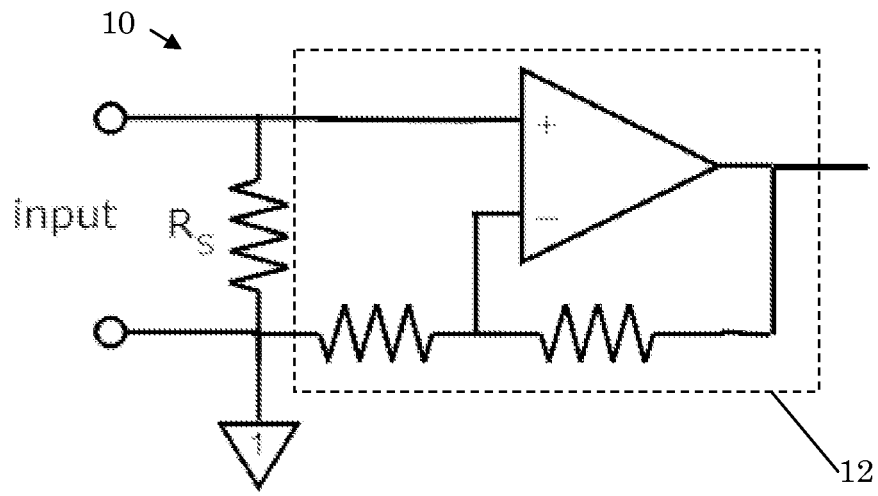
FIG. 1A is a basic diagram of a shunt ammeter configured to simply sense the voltage across a resistor $R_S$.

The disclosure herein relates generally to electrical measurement equipment and, in particular, to an active shunt ammeter for use in measuring electrical current. Such ammeters are often a sub component of measurement products including digital multi-meters (DMM) and source measure units (SMU). There are several ways in which the current through a device under test (DUT) may be measured. FIG. 1A is a basic diagram of a shunt ammeter 10 configured to simply sense the voltage across the resistor $R_S$. $R_S$ must be kept small to not cause a large burden voltage to the input signal. A low noise gain stage 12 amplifies the burden voltage so it can be measured.

FIG. 1B is a basic diagram of a feedback ammeter 20 configured with a high gain op-amp to pull the input circuit through the resistor $R_S$. The operational amplifier (op-amp) 22 keeps the burden voltage low because of its high dc gain (typically greater than 1 million). This allows $R_S$ to be larger allowing the output signal to be larger. However, the op-amps high gain begins to roll off at relatively low frequencies. This causes the burden voltage to increase at higher frequencies as well. If the input is capacitive, it can cause the feedback ammeter to ring or even oscillate.

An active shunt ammeter design addresses these problems. An active shunt ammeter configuration generally replaces the op-amp used in the feedback ammeter with a fixed gain amplifier. The result is a gain that is constant to higher frequencies. At the frequency the amplifier begins to roll off, the capacitor impedance $(1/j\omega C_s)$ is designed to equal $R_S$. The roll off of the parallel impedance of $R_S$ and $C_s$ combined with the roll off the amplifier's gain, results in an input-impedance of the ammeter that is constant across the entire bandwidth of the amplifier. The result is a shunt like ammeter with higher output signal vs. burden voltage than a traditional shunt ammeter and none of the stability issues of feedback ammeters.

Figure 2A:
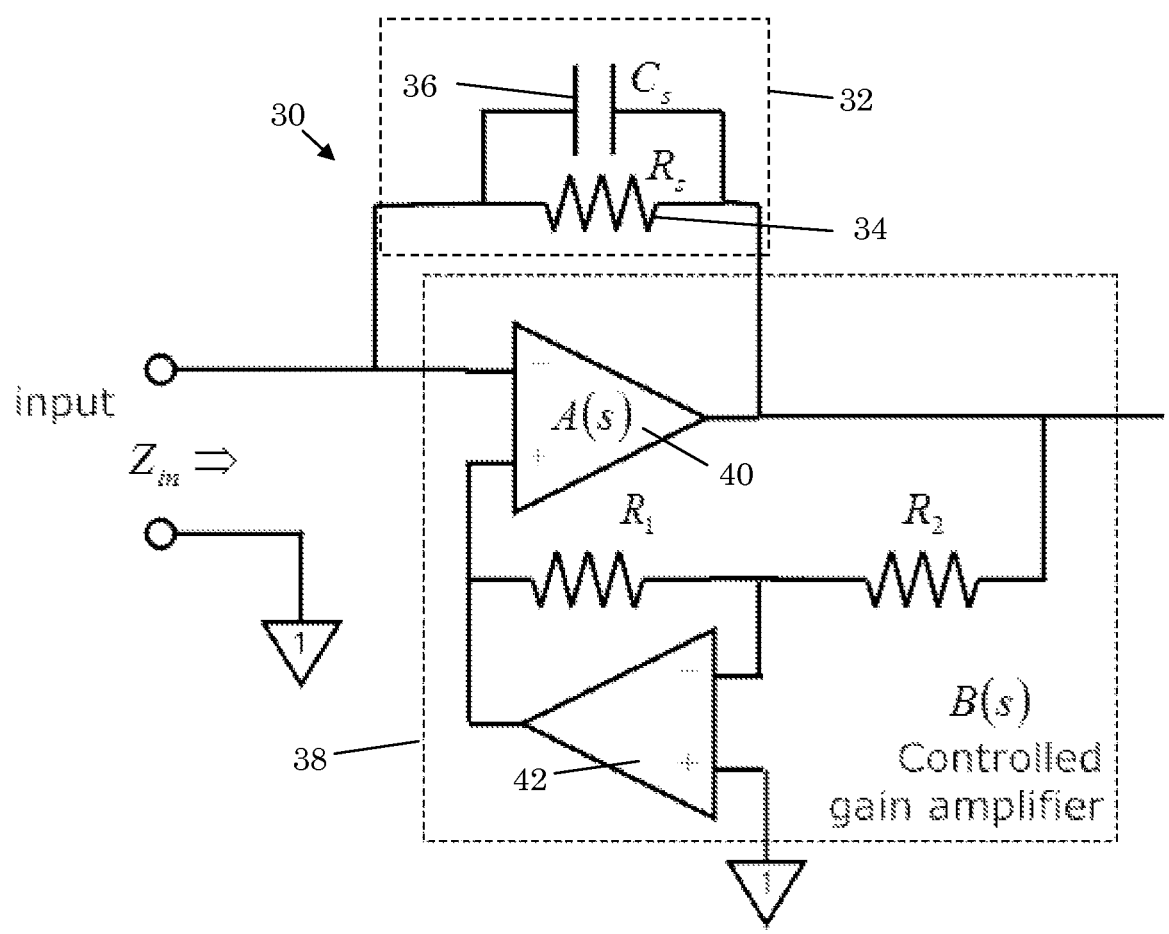
FIG. 2A is an active shunt ammeter design using a controlled negative gain across a parallel RC feedback element.

FIG. 2A is an active shunt ammeter design 30 using a controlled negative gain across a parallel RC feedback element 32 such that input impedance of the circuit is a resistance equal to the R divided by the gain. In this example, the active shunt ammeter 30 includes a fixed gain differential amplifier 38 with a parallel resistor 34 and capacitor 36 connected between the negative-input and output terminals of the fixed gain differential amplifier 38. The RC product of resistor 34 and capacitor 36 is selected to equal the amplifier's gain-bandwidth divided by the fixed gain.

Figure 2B:
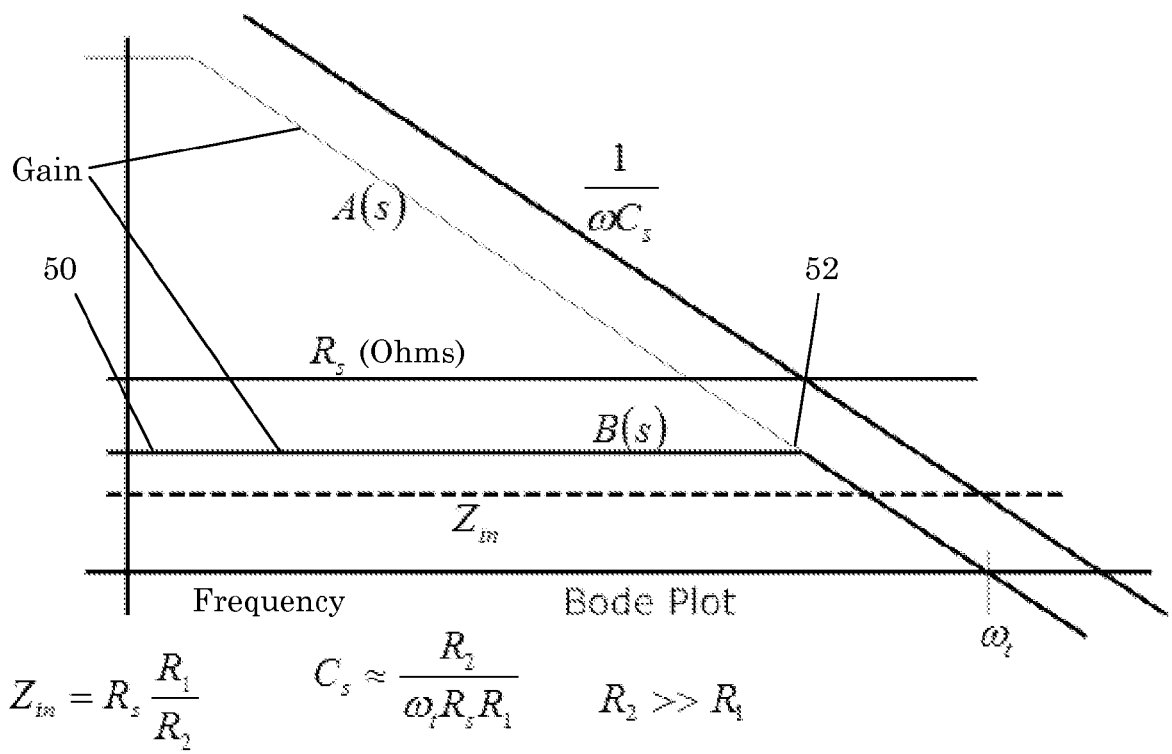
FIG. 2B is a graph showing the gain B(s) of the fixed gain amplifier of the active shunt ammeter in FIG. 2A.

FIG. 2B is a graph showing the gain B(s) of the fixed gain amplifier 38 as well as other parameters. In general, the gain B(s) (shown by reference number 50) of fixed gain amplifier 38 remains essentially constant from DC until a target frequency 52. Once the target frequency 52 is reached, the gain B(s) of the fixed gain amplifier 38 rolls off, e.g., at 20 db per decade. In this example, the operational amplifier 40 in FIG. 2A has a gain A(s) that is much higher than B(s). However, operational amplifier 42 functions as an inverter in the feedback path yielding the composite gain B(s) for the fixed gain amplifier 38. This configuration provides a controlled negative gain across the parallel RC feedback element 34, 36 such that input impedance of the circuit is a resistance equal to the $R_S$ divided by the gain.

In FIG. 2A, $\omega_t$ is the gain bandwidth of the operational amplifier 40. Also shown in FIG. 2A is the resistance of resistor 34 ($R_s$) which remains constant over the frequency range shown. Also shown in FIG. 2A is the input impedance $Z_{in}$ of the active shunt ammeter 30. In general, the input impedance $Z_{in}$ configured to be significantly less than $R_S$ and to appear to be resistive in nature to a frequency than is equal to or greater than $\omega t$. In this example: $Z_{in}=R_s*(R_1/(R_1+R_2))$, $C_S \sim R_2/(\omega_t*R_s*R_1)$ and $R_2>>R_1$.

If the feedback element 32 was resistive only, i.e., capacitor 36 was omitted, the input impedance $Z_{in}$ would increase with frequency after the target frequency 52. The impedance of capacitor 36 may be selected to equal the impedance of the resistor at the target frequency 52. This causes the impedance of the feedback element 32 to drop at the same frequency the operational amplifier 40 begins to roll off. This configuration yields a flat input impedance that does not roll off after the target frequency 52 as shown in FIG. 2B.

Figure 3:
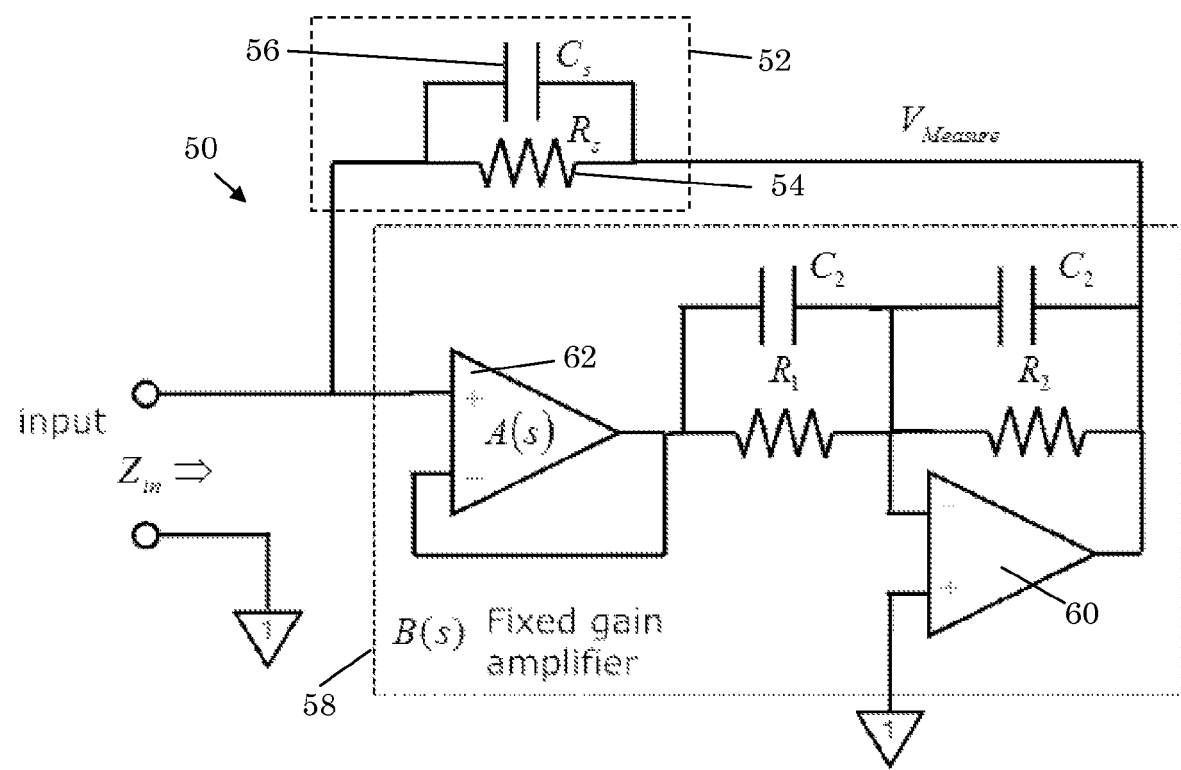
FIG. 3 is an active shunt ammeter design with a fixed gain amplifier constructed using an inverting stage where the inverting gain is set by a resistor ratio.

It should be understood that a fixed gain amplifier may be implemented in several configurations. FIG. 3 is an active shunt ammeter design 50 with a fixed gain amplifier 58 constructed using an inverting stage where the inverting gain is set by $R_2/R_1$. Capacitance, $C_2$, is added across both resistors $R_1$, $R_2$ to reduce the inverting gain to one at the frequency the input buffer is starting to roll off approaching $\omega_t$. In this example: $Z_{in}=R_s*(R_1/R_2)$ and $C_2 \sim 1/(\omega_t*R_{1b})=R_s*C_s/R_{2b}$.

Figure 4:
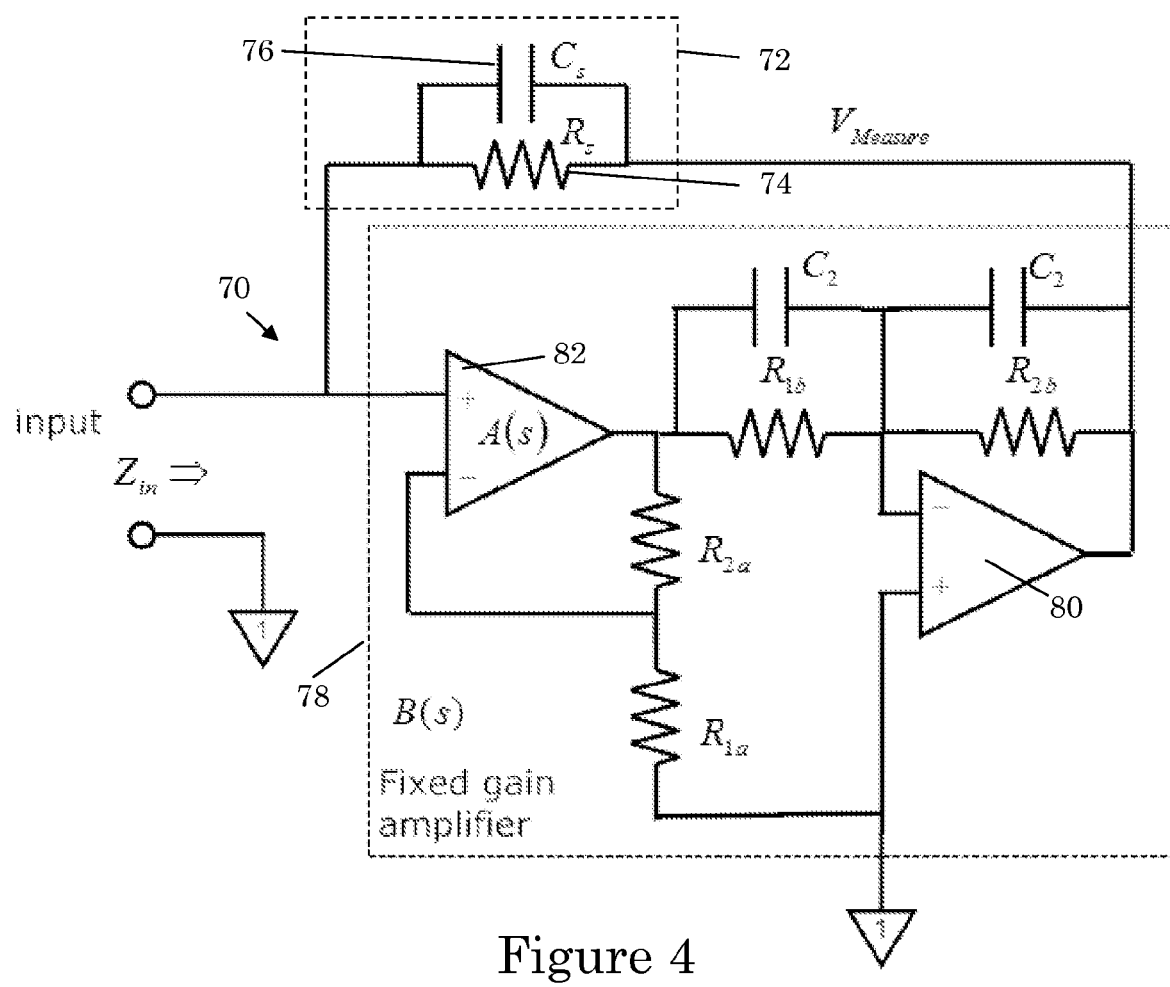
FIG. 4 is an active shunt ammeter design with a fixed gain amplifier where the gain is split between two op-amps.

FIG. 4 is an active shunt ammeter design 70 with a fixed gain amplifier 78 where the gain is split between the op-amps 80, 82. In this example: $Z_{in}=R_s*(R_{1a}*R_{1b})/(R_{2a}*R_{2b})$ and $C_S \sim 1/(\omega_t*R_1)=(R_s*C_s)/R_2$.

Figure 5:
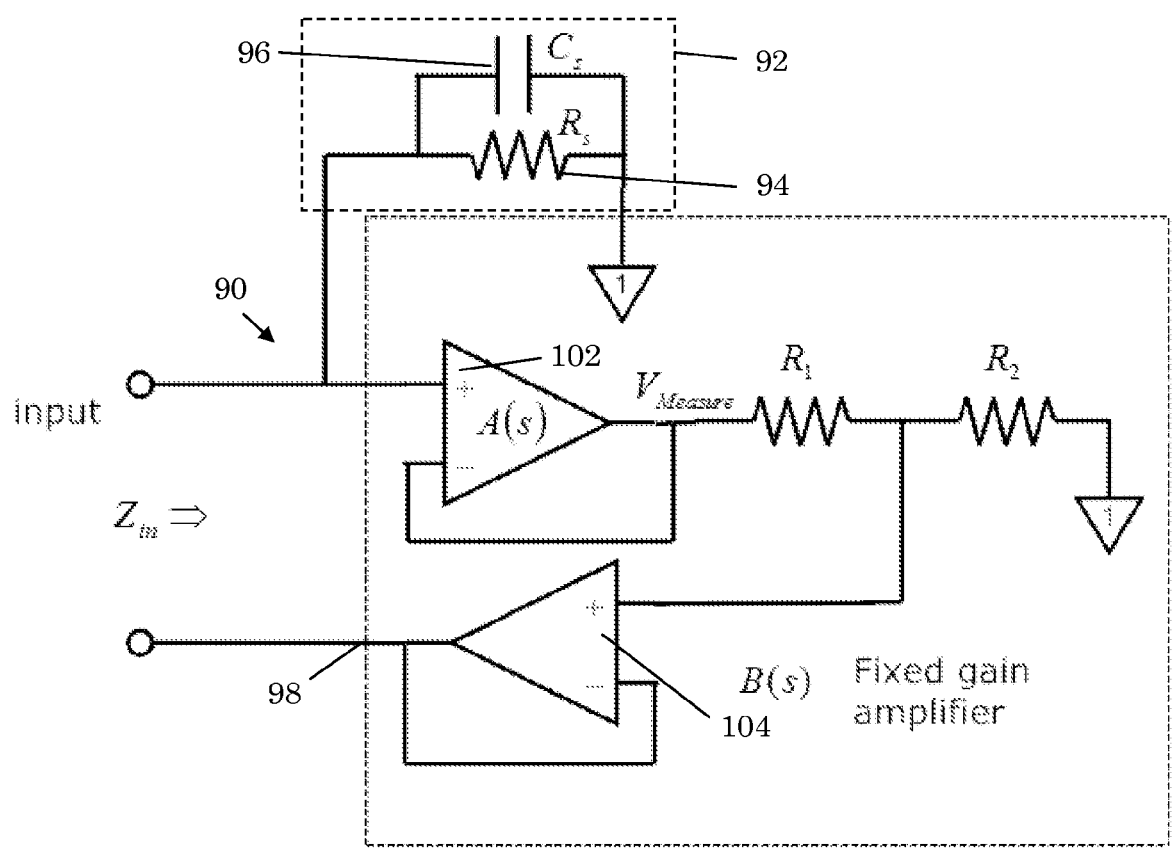
FIG. 5 is an active shunt ammeter design with a fixed gain amplifier where the voltage across the shunt is buffered and slightly attenuated by a resistor ratio.

FIG. 5 is an active shunt ammeter design 90 with a fixed gain amplifier 98 where the voltage across the shunt is buffered and slightly attenuated by a resistor ratio, R2/(R1+R2). In general, the attenuated signal is buffered and drives low side of the input. In this example: $Z_{in}=R_s*(R_1/(R_1+R_2))$.

Figure 6:
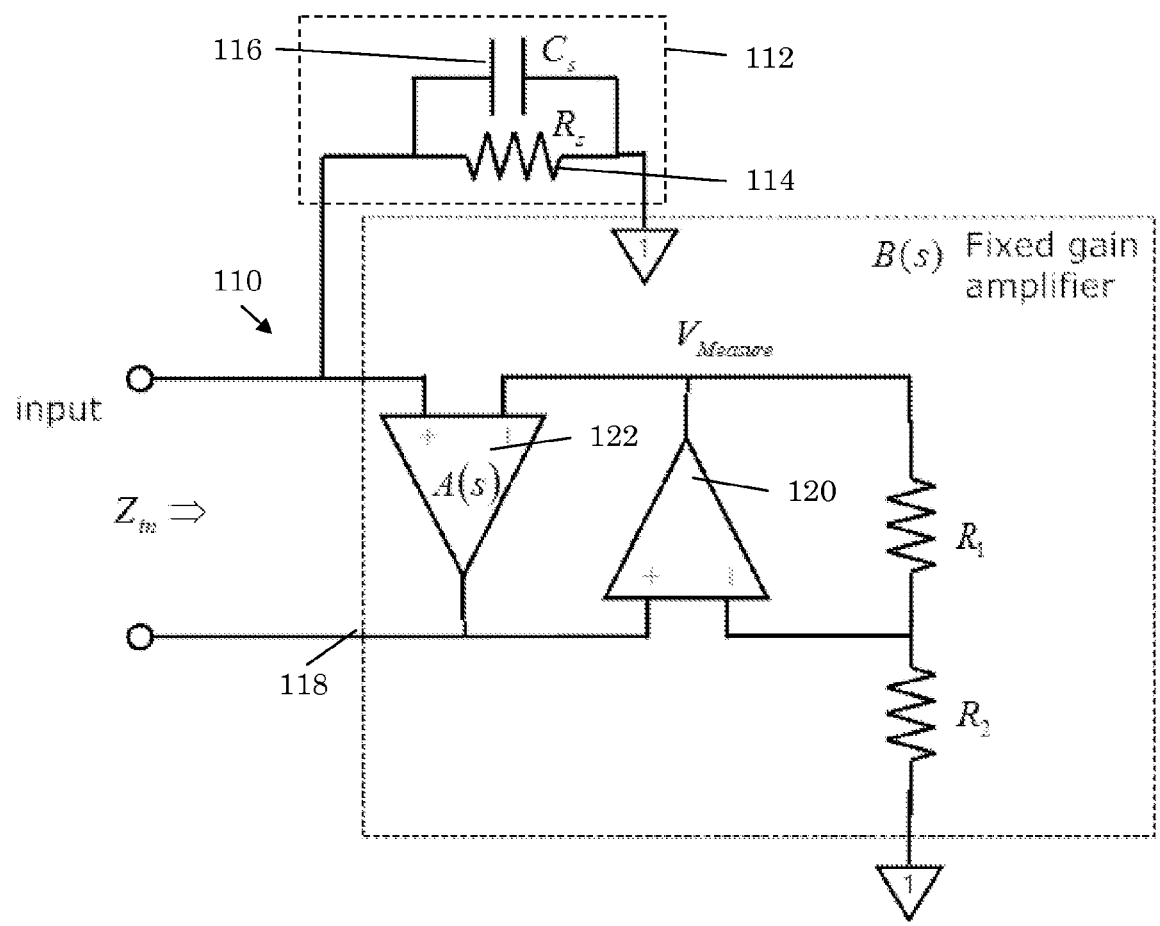
FIG. 6 is an active shunt ammeter design with a fixed gain amplifier where the input op-amp has a slight gain placed in its feedback path.

FIG. 6 is an active shunt ammeter design 110 with a fixed gain amplifier 118 where the input op-amp 122 has a slight gain placed in its feedback. This causes the input op-amp to be a buffer with its output a little less than one, R2/(R1+R2). In this example: $Z_{in}=R_s*(R_1/(R_1+R_2))$.

It should be understood that many variations are possible based on the disclosure herein. Although features and elements are described above in particular combinations, each feature or element can be used alone without the other features and elements or in various combinations with or without other features and elements.

What is claimed is:

1. An active shunt ammeter for measuring current flowing through a device under test (DUT), the active shunt ammeter comprising:
   an input configured to receive an input signal having a frequency within a frequency band and representing the current flowing through the DUT;
   an output configured to generate an output voltage representing the current flowing through the DUT; and
   a gain circuit having an amplifier with a gain characteristic that varies respect to frequency within the frequency band and a parallel RC feedback element having an impedance coupled from an output of the gain circuit to a negative input of the gain circuit, the feedback element impedance being configured to change with frequency to correlate with the amplifier gain characteristic, the amplifier being characterized by a roll-off frequency, and, at the roll-off frequency of the amplifier, an impedance of a resistive element in the parallel RC feedback element is substantially the same as an impedance of a capacitive element in the parallel RC feedback element.

2. The active shunt ammeter of claim 1, wherein the amplifier is a differential amplifier with the parallel RC feedback element coupled between a negative-input terminal and an output terminal.

3. The active shunt ammeter of claim 1, wherein the gain circuit has an input impedance that remains generally constant across the entire bandwidth of the amplifier based on the gain characteristic and the feedback element impedance.

4. The active shunt ammeter of claim 1, wherein the amplifier has a controlled negative gain across the feedback element.

5. The active shunt ammeter of claim 1, wherein the amplifier has an inverting stage having a gain set by a resistor ratio.

6. The active shunt ammeter of claim 1, wherein the amplifier has a gain that is split between two operational amplifiers (op-amps).

7. The active shunt ammeter of claim 1, wherein a voltage across the feedback element is buffered and attenuated by a resistor ratio.

8. The active shunt ammeter of claim 1, wherein the amplifier has an input op-amp with a gain placed in its feedback path.

9. A method of measuring current flowing through a device under test (DUT), the method comprising:
   receiving an input signal having a frequency within a frequency band and representing the current flowing through the DUT;
   generating an output voltage representing the current flowing through the DUT; and
   providing a gain circuit having an amplifier with a gain characteristic that varies respect to frequency within the frequency band and a parallel RC feedback element having an impedance coupled from an output of the gain circuit to a negative input of the gain circuit, the feedback element impedance being configured to change with frequency to correlate with the amplifier gain characteristic, the amplifier being characterized by a roll-off frequency, and, at the roll-off frequency of the amplifier, an impedance of a resistive element in the parallel RC feedback element is substantially the same as an impedance of a capacitive element in the parallel RC feedback element.

10. The method of claim 9, wherein the amplifier is a differential amplifier with a parallel RC feedback element coupled between a negative-input terminal and an output terminal.

11. The method of claim 9, wherein the gain circuit has an input impedance that remains generally constant across the entire bandwidth of the amplifier based on the gain characteristic and the feedback element impedance.

12. The method of claim 9, wherein the amplifier has a controlled negative gain across the parallel RC feedback element.

13. The method of claim 9, wherein the amplifier has an inverting stage having a gain set by a resistor ratio.

14. The method of claim 9, wherein the amplifier has a gain that is split between two operational amplifiers (op-amps).

15. The method of claim 9, wherein a voltage across the feedback element is buffered and attenuated by a resistor ratio.

16. The method of claim 9, wherein the amplifier has an input op-amp with a gain placed in its feedback path.

* * * * *